(12) United States Patent

Bao et al.

(10) Patent No.: US 9,997,518 B2
(45) Date of Patent: Jun. 12, 2018

(54) LOW RESISTIVE ELECTRODE FOR AN EXTENDABLE HIGH-K METAL GATE STACK

(71) Applicant: INTERNATIONAL BUSINESS MACHINES CORPORATION, Armonk, NY (US)

(72) Inventors: Ruqiang Bao, Niskayuna, NY (US); Keith Kwong Hon Wong, Wappingers Falls, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days. days.

(21) Appl. No.: 15/209,201

(22) Filed: Jul. 13, 2016

(65) Prior Publication Data

US 2017/0200720 A1    Jul. 13, 2017

Related U.S. Application Data

(62) Division of application No. 14/993,674, filed on Jan. 12, 2016.

(51) Int. Cl.
*H01L 21/28* (2006.01)
*H01L 21/8234* (2006.01)
(Continued)

(52) U.S. Cl.
CPC ...... *H01L 27/092* (2013.01); *H01L 21/28088* (2013.01); *H01L 21/28255* (2013.01);
(Continued)

(58) Field of Classification Search
CPC ......... H01L 21/28088; H01L 21/28185; H01L 21/823807; H01L 21/823864;
(Continued)

(56) References Cited

U.S. PATENT DOCUMENTS

| 6,174,812 B1 * | 1/2001 | Hsiung | ................. H01L 21/288 257/E21.174 |
| 2012/0056267 A1 * | 3/2012 | Yin | ..................... H01L 21/8258 257/369 |

(Continued)

OTHER PUBLICATIONS

List of IBM Patents of Patent Applications Treated as Related; (Appendix P), Date Filed—Aug. 10, 2016, 2 pages.
U.S. Appl. No. 14/993,674, filed Jan. 12, 2016; Entitled: A Low Resistive Electrode for an Extendable High-k Metal Gate Stack.

*Primary Examiner* — Kimberly Rizkallah
*Assistant Examiner* — Brian Turner
(74) *Attorney, Agent, or Firm* — Cantor Colburn LLP; Jennifer Anda (57) ABSTRACT

In one embodiment, a method of making a semiconductor device includes: forming a substrate; forming an nFET transistor and a pFET transistor on the substrate; wherein forming the nFET transistor comprises first depositing several first layers in and along the inner sidewalls of a trench on the substrate, then depositing a conductive metal comprising cobalt on the several first layers; wherein forming the pFET transistor comprises first depositing several second layers in and along the inner sidewalls of a trench on the substrate, then depositing a conductive metal comprising cobalt on the several second layers.

13 Claims, 11 Drawing Sheets

(51) Int. Cl.
- *H01L 21/336* (2006.01)
- *H01L 21/4763* (2006.01)
- *H01L 21/3205* (2006.01)
- *H01L 29/51* (2006.01)
- *H01L 29/66* (2006.01)
- *H01L 27/092* (2006.01)
- *H01L 29/49* (2006.01)
- *H01L 21/8238* (2006.01)
- *H01L 21/768* (2006.01)
- *H01L 29/161* (2006.01)

(52) U.S. Cl.
CPC .......... *H01L 21/76843* (2013.01); *H01L 21/823842* (2013.01); *H01L 21/823857* (2013.01); *H01L 29/161* (2013.01); *H01L 29/4958* (2013.01); *H01L 29/4966* (2013.01); *H01L 29/517* (2013.01); *H01L 29/518* (2013.01)

(58) Field of Classification Search
CPC .......... H01L 29/517; H01L 21/823857; H01L 29/66545; H01L 29/513
USPC ........ 257/369, 288, 368, 392, 410, E21.177, 257/E27.062; 438/276, 585
See application file for complete search history.

(56) References Cited

U.S. PATENT DOCUMENTS

| | | | |
|---|---|---|---|
| 2013/0037865 A1* | 2/2013 | Nogami | H01L 21/823842 257/288 |
| 2013/0099320 A1* | 4/2013 | Lee | H01L 29/4966 257/368 |
| 2013/0161754 A1* | 6/2013 | Su | H01L 21/823807 257/369 |
| 2013/0240979 A1* | 9/2013 | Lim | H01L 29/66545 257/327 |
| 2013/0270328 A1* | 10/2013 | Di Cioccio | H01L 21/2007 228/176 |
| 2013/0299922 A1* | 11/2013 | Choi | H01L 21/82345 257/412 |
| 2013/0302974 A1* | 11/2013 | Hahn | H01L 21/823842 438/585 |
| 2014/0004693 A1* | 1/2014 | Hoon | H01L 21/28079 438/589 |
| 2014/0070307 A1* | 3/2014 | Ando | H01L 21/28088 257/330 |
| 2014/0231922 A1* | 8/2014 | Kim | H01L 29/401 257/369 |
| 2014/0361352 A1* | 12/2014 | Hung | H01L 21/28008 257/288 |
| 2015/0126023 A1* | 5/2015 | Choi | H01L 21/28158 438/591 |
| 2015/0325681 A1* | 11/2015 | Lee | H01L 29/4966 438/199 |

* cited by examiner

LOW RESISTIVE ELECTRODE FOR AN EXTENDABLE HIGH-K METAL GATE STACK

DOMESTIC PRIORITY

This application is a Divisional of U.S. patent application Ser. No. 14/993,674 filed Jan. 12, 2016 entitled "A LOW RESISTIVE ELECTRODE FOR AN EXTENDABLE HIGH-K METAL GATE STACK," the contents of which in its entirety are incorporated by reference.

BACKGROUND

The present invention relates to a method for fabricating a low resistive electrode for an extendable high-κ metal gate (HKMG) stack, and more specifically, to fabricating a metal gate electrode using cobalt.

The metal oxide semiconductor field effect transistor (MOSFET) is a transistor used for amplifying or switching electronic signals. The MOSFET has a source, a drain, and a gate electrode of metal or metal oxide. The metal gate is electrically insulated from the main semiconductor n-channel or p-channel by a thin layer of insulating material, for example, silicon dioxide, glass, or high κ material such as titanium nitride, which makes the input resistance of the MOSFET relatively high. The metal gate stack includes the metal gate, the insulating layer, and possibly other layers. The gate voltage controls whether the path from drain to source is an open circuit ("off") or a resistive path ("on"). When the gate electrode is made smaller to allow smaller devices, the smaller critical dimension (CD) of the gate results in increased resistivity of the metal gate stack.

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

Some devices, such as complementary metal oxide semiconductors (CMOS) have both nFET and pFET transistors, usually mounted on the same substrate.

SUMMARY

According to an embodiment of the present invention, a method of making a semiconductor device includes: forming a substrate; forming a first gate stack of a first transistor on the substrate, wherein forming the first gate stack comprises: depositing a high-k dielectric layer in and along the inner sidewalls of a trench arranged on the substrate, depositing an nFET stack on the high-k dielectric layer, depositing a barrier layer on the nFET stack, and depositing a conductive metal comprising cobalt on the barrier layer; and forming a second gate stack of a second transistor on the substrate adjacent to the first gate stack of the first transistor, forming the second gate stack comprising depositing a high-k dielectric layer in and along the inner sidewalls of a trench arranged on the substrate, depositing a barrier layer on the high-k dielectric layer, and depositing a conductive metal comprising cobalt on the barrier layer.

According to another embodiment, a method of making a semiconductor device includes: forming a substrate; forming a first gate stack of a first transistor on the substrate, wherein forming the first gate stack comprises: depositing a high-k dielectric layer in and along the inner sidewalls of a trench arranged on the substrate, depositing an nFET stack on the high-k dielectric layer, depositing a barrier layer on the nFET stack, and depositing a conductive metal comprising cobalt on the barrier layer; and forming a second gate stack of a second transistor on the substrate adjacent to the first gate stack of the first transistor, forming the second gate stack comprising depositing a high-k dielectric layer in and along the inner sidewalls of a trench arranged on the substrate, depositing a barrier layer on the high-k dielectric layer, and depositing a conductive metal comprising cobalt on the barrier layer; wherein the first transistor is an nFET, the second transistor is a pFET, and wherein the nFET is subjected to patterning before the pFET.

Yet, according to another embodiment, a semiconductor device includes an nFET and a pFET on a substrate; wherein the nFET comprises a high-k dielectric layer disposed in and along the inner sidewalls of a trench arranged on the substrate, an nFET stack disposed on the high-k dielectric layer, and a conductive metal comprising cobalt disposed on the high-k dielectric layer, wherein the conductive metal is the innermost layer in the trench; and wherein the pFET comprises a high-k dielectric layer disposed in and along the inner sidewalls of a trench on the substrate, a barrier layer or pFET work function layer disposed on the high-k dielectric layer, and a conductive metal comprising cobalt disposed on the high-k dielectric layer wherein the conductive metal is the innermost layer in the trench.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-5B illustrate an exemplary method of making a semiconductor device according to a first embodiment of the present invention, in which:

DETAILED DESCRIPTION

FETs such as nFETs and pFETs may have a variety of different layers lining a trench, with an electrode as the central part of the trench. Making smaller transistors allows for more memory within smaller spaces. However, as transistors with FETs scale to smaller dimensions, the resistivity may increase, which may affect device efficiency. Conventional FET metal electrodes made of the conductive metal tungsten may have higher resistivity in smaller devices, which may present a challenge in making functional FET devices with smaller critical dimensions.

However, it has been discovered that, as described herein, compared with tungsten, the conductive metal cobalt has a smaller increase in resistivity as the device dimensions decrease. Thus, these FET devices with cobalt electrodes can provide adequate device function at smaller dimensions.

Accordingly, embodiments of the present invention provide methods of making semiconductor devices with different contact liners. The inventive process flow optimizes the vertical metal contact resistance. Embodiments of the inventive device structure and methods provide reduced contact resistance in semiconductor devices by methods using one mask, or alternatively, two masks. It is noted that like reference numerals refer to like elements across different embodiments.

In one embodiment, a method of making a semiconductor device includes: forming a substrate; forming an nFET transistor and a pFET transistor on the substrate; wherein forming the nFET transistor comprises first depositing several first layers in and along the inner sidewalls of a trench on the substrate, then depositing a conductive metal comprising cobalt on the several first layers; wherein forming the pFET transistor comprises first depositing several second layers in and along the inner sidewalls of a trench on the substrate, then depositing a conductive metal comprising cobalt on the several second layers.

In the embodiments that follow, the composition of numbered components from one figure can be used for the composition of a component of the same name but different number in another embodiment. For example high-k dielectric 201 in FIG. 2A has a composition which can be described similarly to the composition of high-k dielectric layer 101 in FIG. 1A.

Figure 1A:
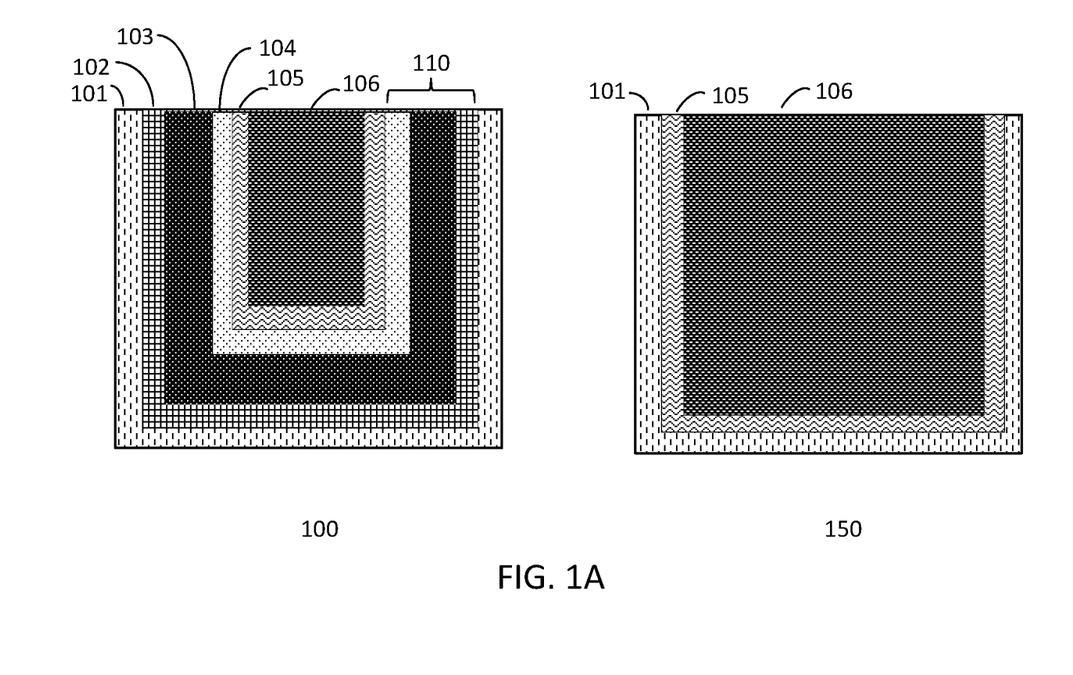
FIG. 1A is a cross-sectional side view, perpendicular to the gate, of an nFET and a pFET.

Turning now to the Figures, FIGS. 1A-5B illustrate an exemplary method of making a semiconductor device according to a first embodiment of the present invention. FIG. 1A is a cross-sectional side view of an nFET 100 (a first transistor) and a pFET 150 (a second transistor) as part of a CMOS. Embodiments of the present invention include two types of transistors, a first transistor and a second transistor. The first transistor and second transistor are different transistors, and in some embodiments, may not be limited to an nFET and a pFET.

The substrate is not shown and depends on the type of transistor. For example, when transistors are FinFET or nanowire devices, the substrate (or semiconductive active regions of the devices) includes fins or nanowires. When the transistors are planar devices, the substrate may include a semiconductor material with shallow trench isolation (STI) regions between the first transistor and second transistor. The substrate may further include junction isolations. In some aspects of the first embodiment the substrate includes silicon, germanium, or a combination thereof.

The nFET 100 includes a high-k dielectric layer 101 lining the trench of the nFET; and an nFET stack 110 is disposed on the high-k dielectric layer 101, the nFET stack 110 comprising one or more metal layers. In an embodiment, the nFET stack has three metal layers, a first metal layer 102, a second metal layer 103, and a third metal layer 104; a barrier layer 105 is disposed on layer 104; and a conductive metal 106 is disposed on barrier layer 105 and filling the remaining interior space of the nFET 100.

The pFET 150 includes a high-k dielectric layer 101 lining the trench of the pFET 150, a barrier layer 105 disposed on the high-k dielectric layer 101, and a conductive metal 106 disposed on barrier layer 105 and filling the remaining interior space of the pFET 150.

Figure 1B:
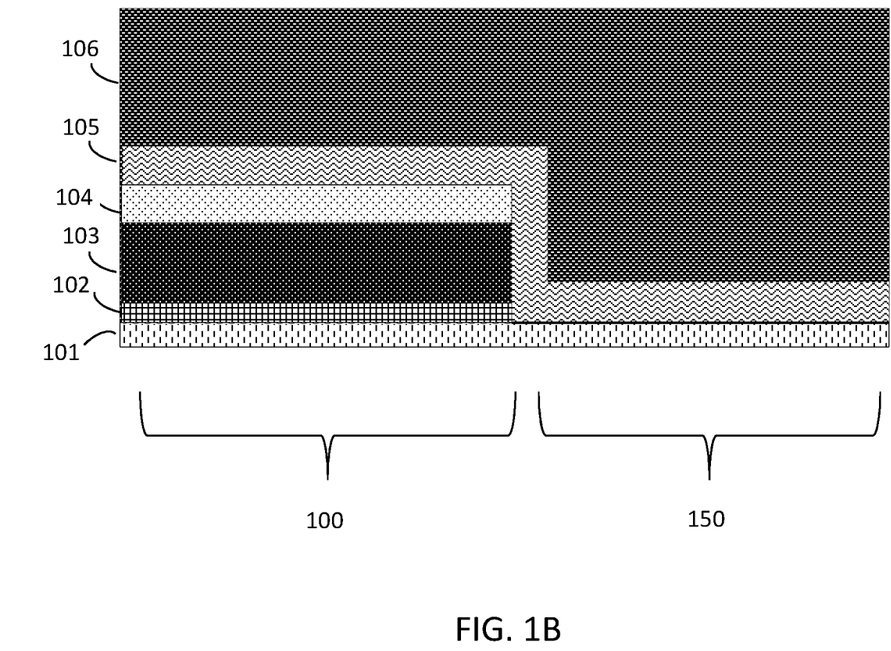
FIG. 1B is a cross-sectional side view, parallel to the gate, of the nFET and pFET of FIG. 1A for a shared gate between nFET and pFET.

An nFET first process that could be used in the method of the first embodiment, to make a device as shown in FIGS. 1A and 1B, is described below. The process starts on a silicon substrate with $SiO_2/HfO_2$ growth, followed by post-deposition annealing. The nFET stack is deposited subsequently, followed by lithography and reactive ion etch, so that the nFET gate stack is removed from the pFET region. The barrier layer is then deposited, and cobalt is deposited as the gate electrode. Further steps, such as chemical mechanical polishing, typical for production of such devices can be added at the end of the process.

The high-k dielectric layer can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum.

The high-k dielectric material layer may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The nFET stack is a gate stack that includes one or more metal layers. The metal layers in the nFET stack such as a first metal layer 102, a second metal layer 103, a third metal layer 104, and so forth, may include one or more n-type work function materials. N-type work function metal materials for the gate stack may include hafnium, zirconium, titanium, tantalum, or aluminum metal carbides (e.g., hafnium carbide, zirconium carbide, titanium carbide, and aluminum carbide), aluminides, TiAl, metal nitride, or any combination thereof.

The barrier layer 105 may be formed of titanium nitride, tantalum nitride, or other suitable metal nitrides, and metal carbides such as TiC and TaC. In some embodiments the metal nitride may be mixed with metallic titanium or tantalum. The barrier layer 105 may be formed by PVD processes such as sputtering, or by CVD or ALD, to a thickness of about 5 to 1000 Angstroms.

The conductive metal 106 forms a metal electrode and includes cobalt. The conductive metal 106 in the metal electrode may differ between the nFET 100 and the pFET 150, but includes cobalt in each case. In some embodiments, the conductive metal 106 ranges from about 60 to about 100 wt % cobalt, or from 80 to about 100 wt % cobalt, or from about 90 to about 100 wt % cobalt based on the conductive metal. In some embodiments, the conductive metal consists essentially of cobalt. The conductive metal may include other metals including aluminum, platinum, gold, tungsten, titanium, or any combination thereof. The conductive metal may be deposited by a known deposition process, for example, CVD, PECVD, PVD, plating, thermal or e-beam evaporation, sputtering, or sputtering.

In some embodiments, a fin is patterned in the substrate to form a FinFET device. The nFET stack 110 is disposed over and around the fin. In other embodiments, a nanowire or stacked nanowires is patterned in the substrate to form a nanowire device. The nFET stack 110 is disposed over and around the fin. Yet, in other embodiments, the devices formed by the disclosed processes are planar devices. In some embodiments, the nFET stack may further comprise a dielectric cap layer on top of the nFET stack 110.

FIG. 1B is a cross-sectional side view, parallel to the gate, of the nFET 100 and pFET 150 from FIG. 1A.

Figure 2A:
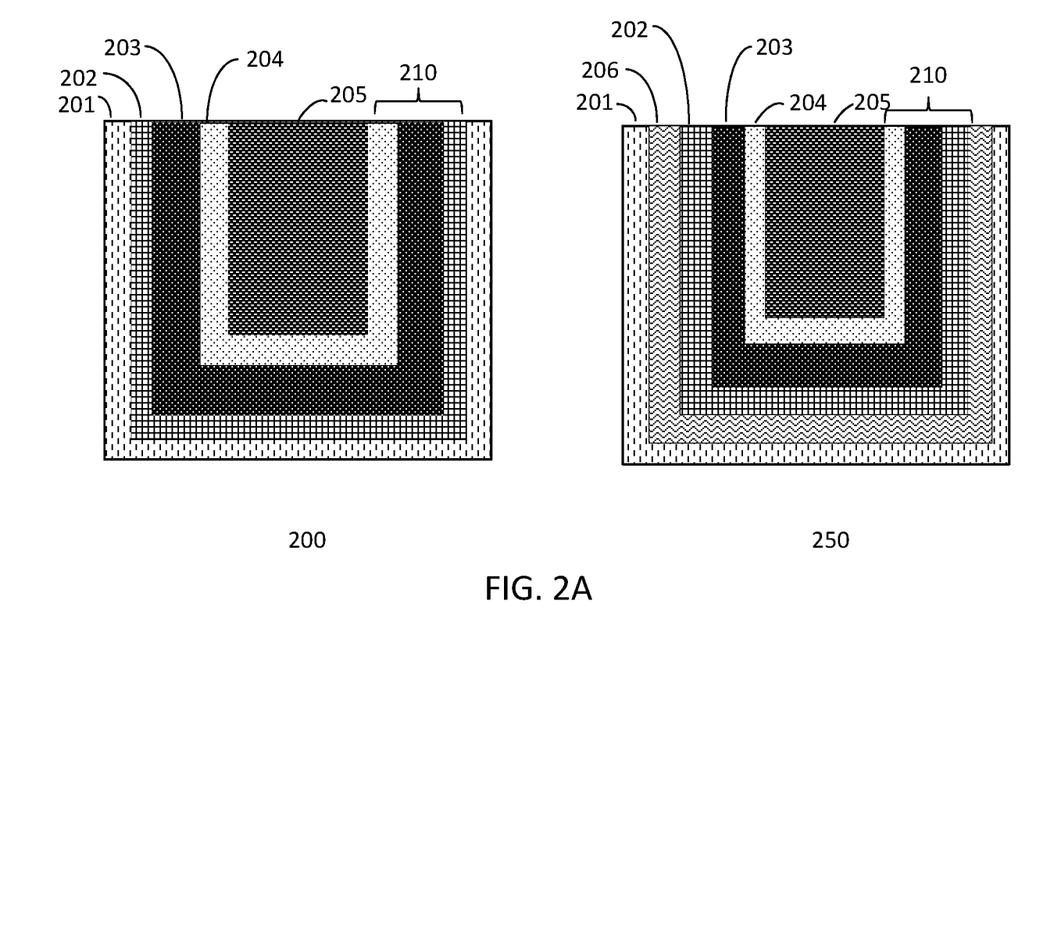
FIG. 2A is a cross-sectional side view, perpendicular to the gate, of an nFET and a pFET.

FIG. 2A is a cross-sectional side view of a pFET 250 (a first transistor) and an nFET 200 (a second transistor) as part of a CMOS according to a second embodiment of the present invention.

The nFET 200 includes a high-k dielectric layer 201 lining the trench of the nFET; a nFET stack 210 disposed on the high-k dielectric layer 201, the nFET stack 210 including first metal layer 202, second metal layer 203, and third metal layer 204; and a conductive metal 205 disposed on third metal layer 204 and filling the remaining interior space of the nFET.

The pFET 250 includes a high-k dielectric layer 201 forming the outside layer of the pFET, a pFET work function layer 206 disposed on the high-k dielectric layer 201, a nFET stack 210 disposed on the pFET work function layer 206, the nFET stack 210 including first metal layer 202, second metal layer 203, and third metal layer 204, and a conductive metal 205 disposed on third metal layer 204 and filling the remaining interior space of the pFET.

Figure 2B:
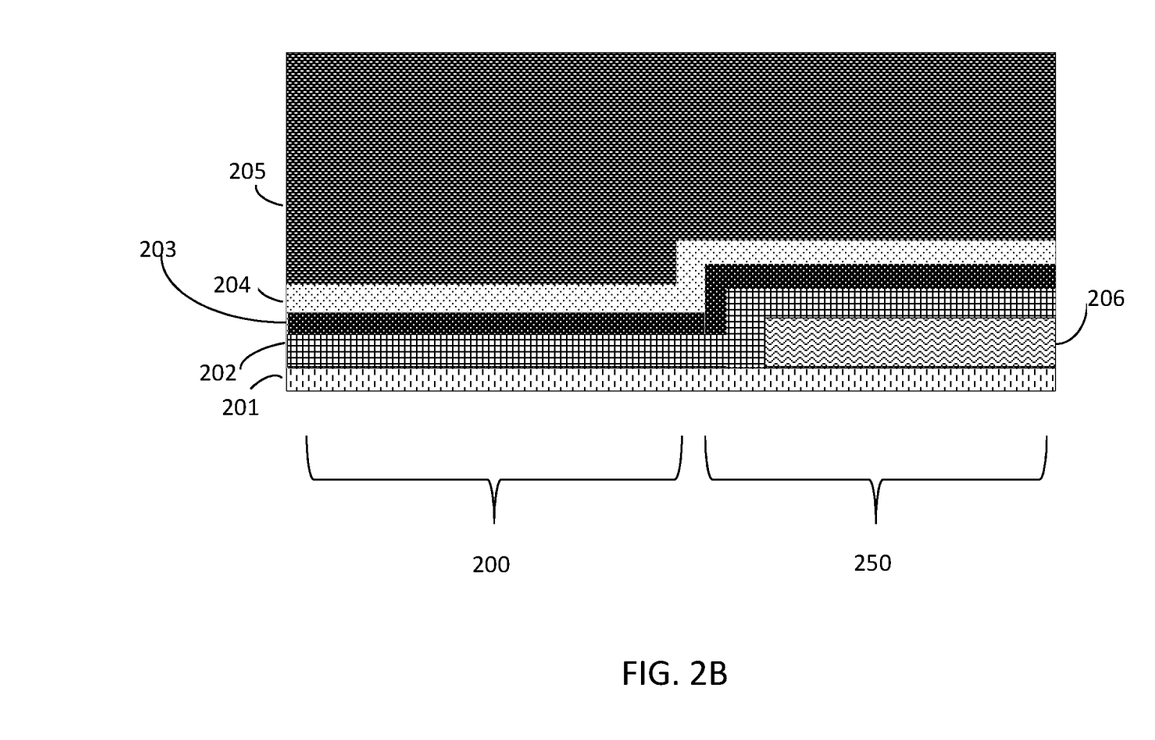
FIG. 2B is a cross-sectional side view, parallel to the gate, of the NFET and PFET of FIG. 2A for a shared gate between nFET and pFET.

FIG. 2B is a cross-sectional side view, parallel to the gate, of the nFET 200 and pFET 250 from FIG. 2A.

A pFET first process that could be used in the method of the second embodiment, to make a device as shown in FIGS. 2A and 2B, is described below. The process starts on a silicon substrate with $SiO_2/HfO_2$ growth, followed by post-deposition annealing. The pFET stack is deposited subsequently, followed by lithography and reactive ion etch, so that the pFET gate stack is removed from the nFET region. Cobalt is then deposited as the gate electrode. Further steps, such as chemical mechanical polishing, typical for production of such devices can be added at the end of the process.

The pFET work function layer 206 may be formed of titanium nitride, tantalum nitride, or other suitable metal nitrides, metal carbides, or other metals suitable as p-work function metals. In some embodiments the metal nitride may be mixed with metallic titanium or tantalum. The pFET work function layer 206 can be formed by PVD processes such as sputtering, or by CVD or ALD, to a thickness of about 10 to 1000 Angstroms. In some embodiments the pFET work function layer can be called a barrier layer. Thus, in some embodiments the barrier layer comprises one or more metal nitrides which can comprise titanium nitride, tantalum nitride, or any combination thereof, and can further comprise any metal suitable as a pFET work function metal such as TiC or TaC.

In some aspects of the second embodiment, the substrate includes silicon, germanium, or a combination thereof.

Figure 3A:
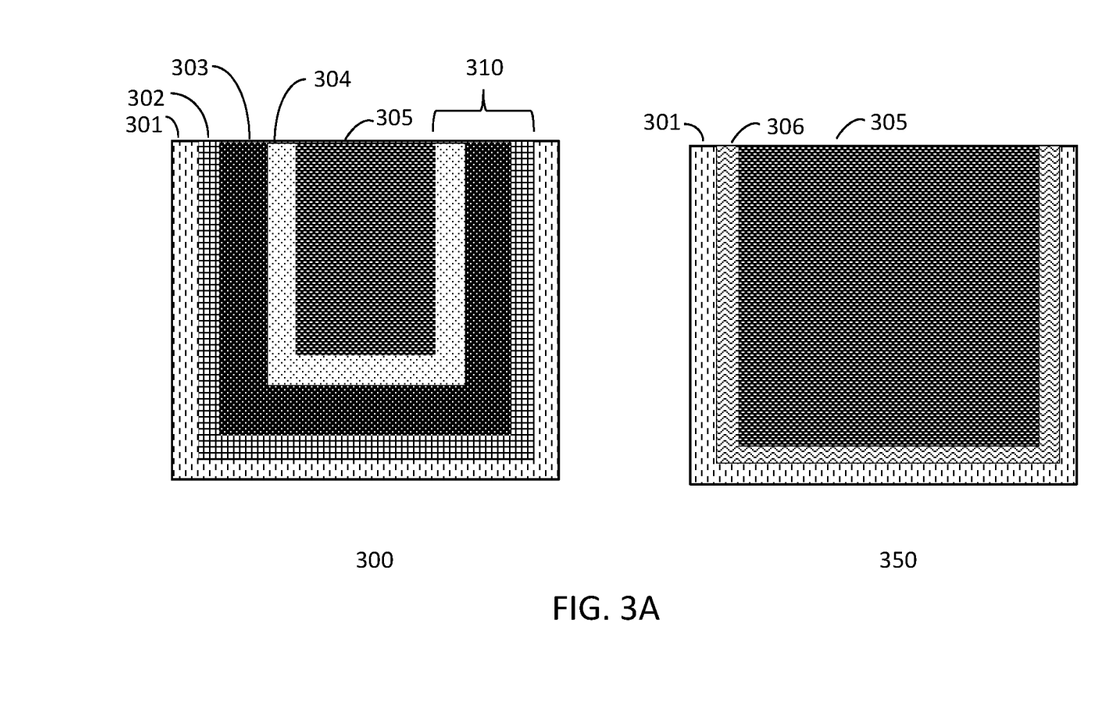
FIG. 3A is a cross-sectional side view, perpendicular to the gate, of an nFET and a pFET.

FIG. 3A is a cross-sectional side view of a pFET 350 (a first transistor) and an nFET 300 (a second transistor) as part of a CMOS according to a third embodiment of the present invention.

The nFET 300 includes a high-k dielectric layer 301 lining the trench of the nFET; a nFET stack 310 disposed on the high-k dielectric layer 301, the nFET stack 310 including first metal layer 302, second metal layer 303, and third metal layer 304; and a conductive metal 305 disposed on third metal layer 304 and filling the remaining interior space of the nFET.

The pFET 350 includes a high-k dielectric layer 301 lining the trench of the pFET, a pFET work function layer 306 disposed on the high-k dielectric layer 301, and a conductive metal 305 disposed on the pFET work function layer 306 and filling the remaining interior space of the pFET.

Figure 3B:
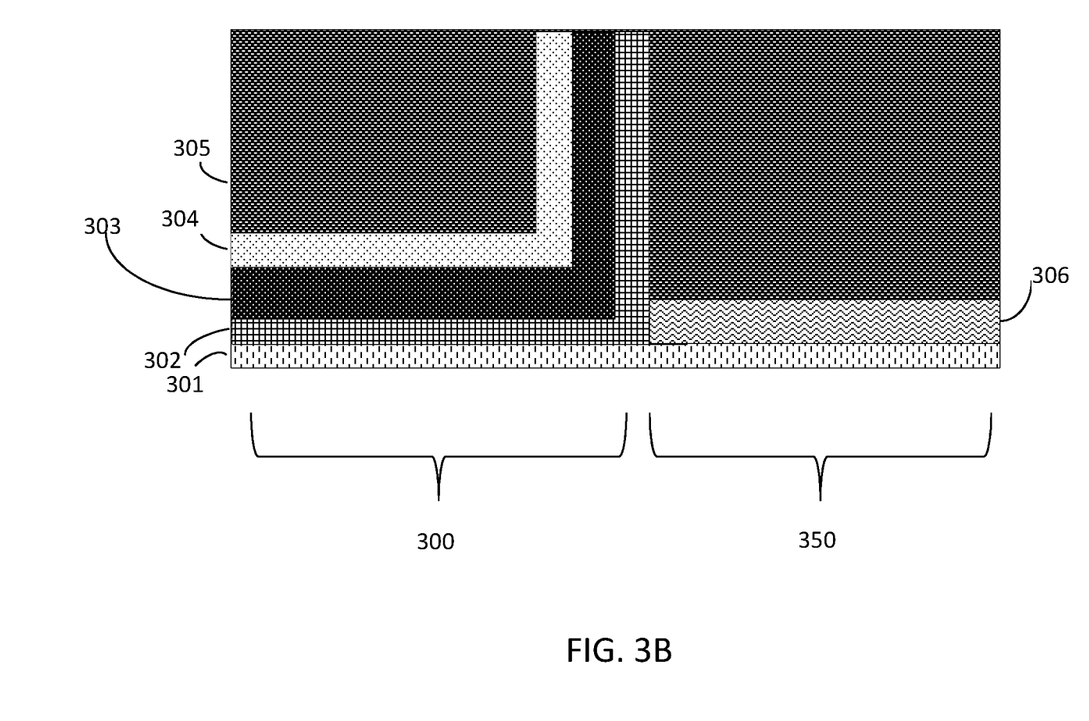
FIG. 3B is a cross-sectional side view, parallel to the gate, of the nFET and pFET of FIG. 3A for a shared gate between nFET and pFET.

FIG. 3B is a cross-sectional side view, parallel to the gate, of the nFET 300 and pFET 350 from FIG. 3A.

A pFET first process that could be used in the method of the third embodiment, to make a device as shown in FIGS. 3A and 3B, is described below. The process starts on a silicon substrate with $SiO_2/HfO_2$ growth, followed by post-deposition annealing. The pFET stack is deposited subsequently, and cobalt is used to fill the gate trench completely. Then a partial chemical mechanical polishing of the gate is performed, stopping on the interlayer dielectric oxide which is part of the substrate on which the high-k dielectric layer is disposed. Then lithography and reactive ion etch are performed, so that the pFET gate stack and cobalt are then removed from the nFET region. Then an nFET gate stack is deposited in the nFET region, and cobalt is then deposited as the gate electrode. Further steps, such as chemical mechanical polishing, typical for production of such devices can be added at the end of the process.

In some aspects of the third embodiment, the substrate includes silicon.

Figure 4A:
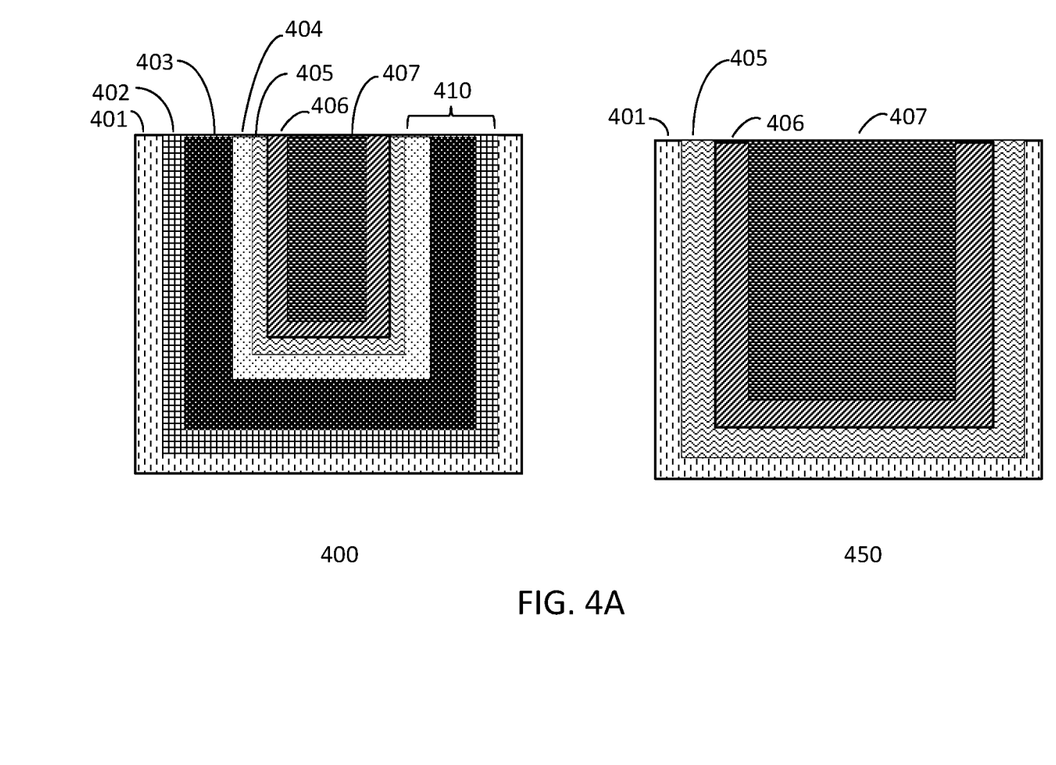
FIG. 4A is a cross-sectional side view, perpendicular to the gate, of an nFET and a pFET.

FIG. 4A is a cross-sectional side view of an nFET 400 (a first transistor) and a pFET 450 (a second transistor) as part of a CMOS according to a fourth embodiment of the present invention.

The nFET 400 includes a high-k dielectric layer 401 lining the trench of the nFET; a nFET stack 410 disposed on the high-k dielectric layer 401, the nFET stack 410 including first metal layer 402, second metal layer 403, and third metal layer 404; a barrier layer 405 disposed on the third metal layer 404; an N-type material layer 406 disposed on the barrier layer 405, and a conductive metal 407 disposed on the N-type material layer 406 and filling the remaining interior space of the nFET.

The pFET 450 includes a high-k dielectric layer 401 lining the trench of the pFET, a barrier layer 405 disposed on the high-k dielectric layer 401, an N-type material layer 406 disposed on the barrier layer 405, and a conductive metal 407 disposed on the N-type material layer 406 and filling the remaining interior space of the pFET.

Figure 4B:
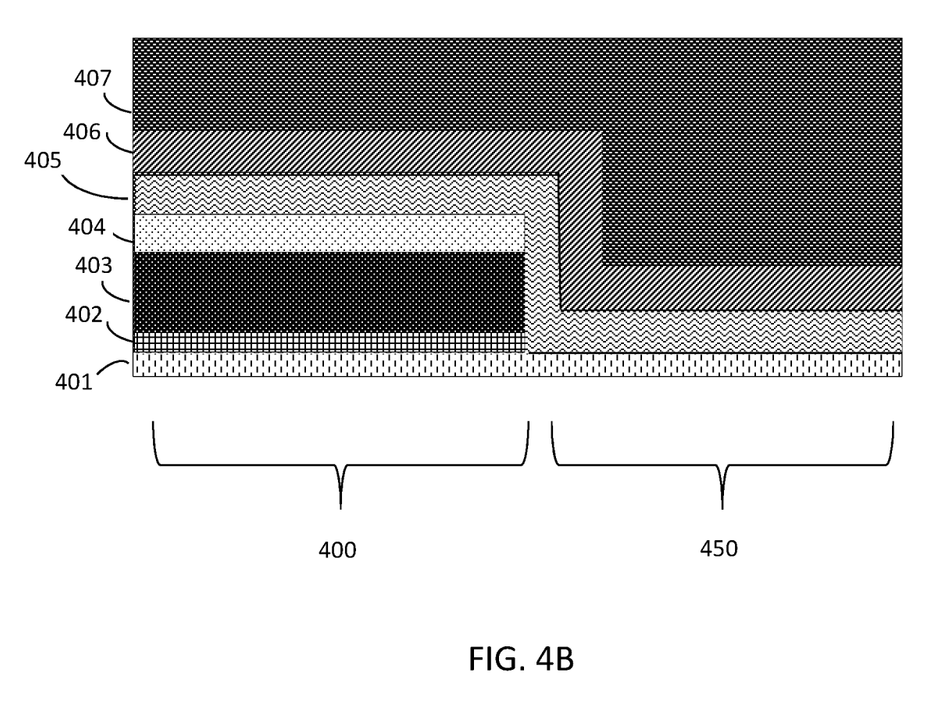
FIG. 4B is a cross-sectional side view, parallel to the gate, of the nFET and pFET of FIG. 4A for a shared gate between nFET and pFET.

FIG. 4B is a cross-sectional side view, parallel to the gate, of the nFET 400 and pFET 450 from FIG. 4A.

An nFET first process that could be used in the method of the fourth embodiment, to make a device as shown in FIGS. 4A and 4B, is described below. The process starts on a silicon/germanium substrate with $SiO_2/HfO_2$ growth, followed by postdeposition annealing. The nFET stack is deposited subsequently, followed by lithography and reactive ion etch, so that the nFET gate stack is removed from the pFET region. The barrier layer is then deposited, then nFET type metal is deposited, and then cobalt is deposited as the gate electrode. Further steps, such as chemical mechanical polishing, typical for production of such devices can be added at the end of the process.

The N-type material layer 406 can include hafnium, zirconium, titanium, tanatalum, aluminum, hafnium carbide, zirconium carbide, titanium carbide, tantalum carbide, aluminum carbide, or a combination thereof.

In some aspects of the fourth embodiment, the substrate includes silicon and germanium.

Figure 5A:
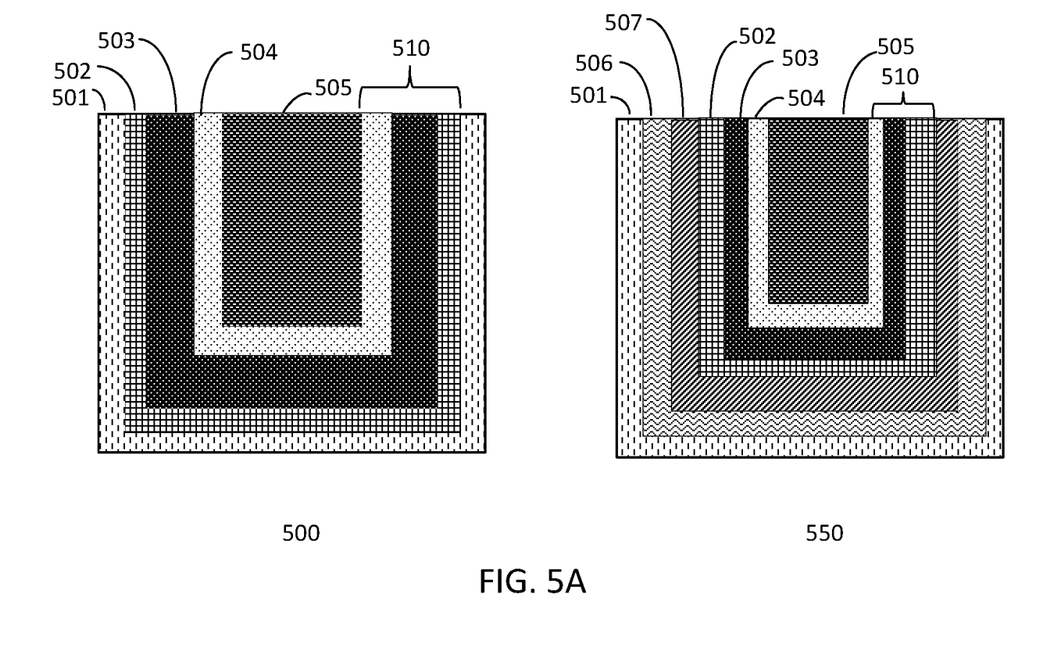
FIG. 5A is a cross-sectional side view, perpendicular to the gate, of an nFET and a pFET.

FIG. 5A is a cross-sectional side view of a pFET 550 (a first transistor) and an nFET 500 (a second transistor) as part of a CMOS according to a fifth embodiment of the present invention.

The nFET 500 includes a high-k dielectric layer 501 lining the trench of the nFET; a nFET stack 510 disposed on the high-k dielectric layer 501, the nFET stack 510 including first metal layer 502, second metal layer 503, and third metal layer 504; and a conductive metal 505 disposed on third metal layer 504 and filling the remaining interior space of the nFET.

The pFET 550 includes a high-k dielectric layer 501 forming the outside layer of the pFET, a pFET work function layer 506 disposed on the high-k dielectric layer 501, an N-type material layer 507 disposed on the pFET work function layer 506, a nFET stack 510 disposed on the N-type material layer 507, the nFET stack 510 including first metal layer 502, second metal layer 503, and third metal layer 504; and a conductive metal 505 disposed on third metal layer 504 and filling the remaining interior space of the pFET.

Figure 5B:
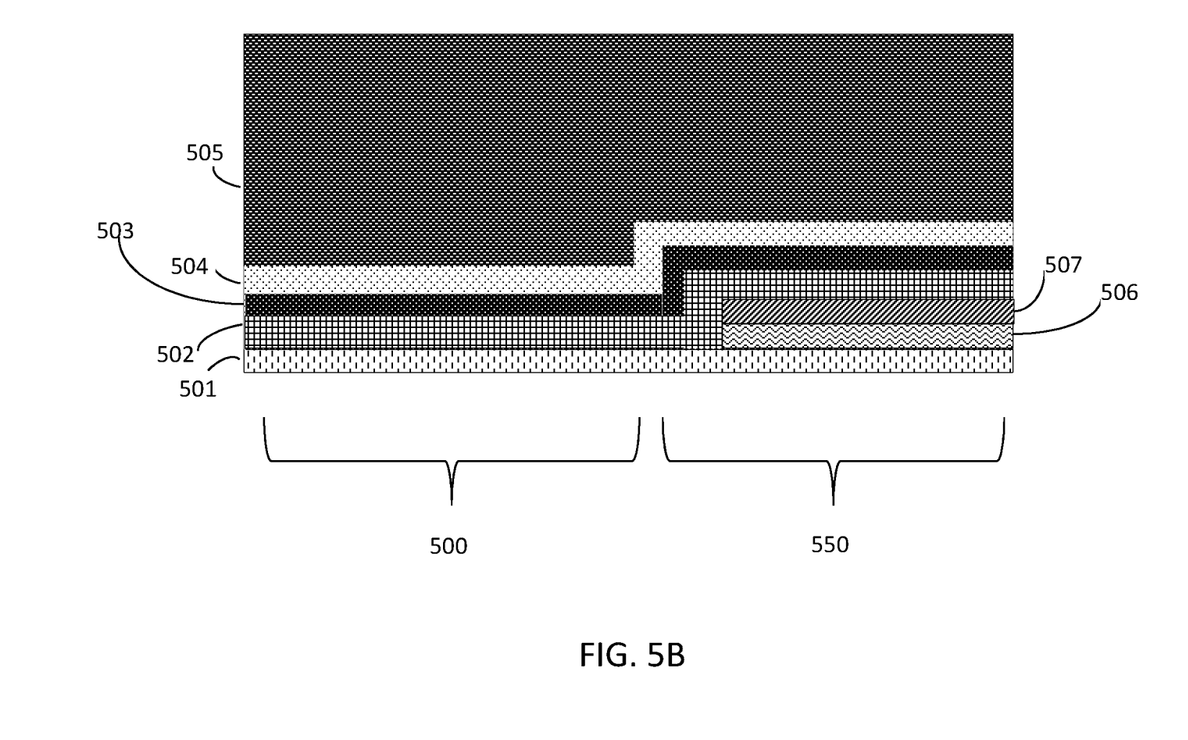
FIG. 5B is a cross-sectional side view, parallel to the gate, of the nFET and pFET of FIG. 5A for a shared gate between nFET and pFET.

FIG. 5B is a cross-sectional side view, parallel to the gate, of the nFET 500 and pFET 550 from FIG. 5A.

A p FET first process that could be used in the method of the fifth embodiment, to make a device as shown in FIGS. 5A and 5B, is described below. The process starts on a silicon/germanium substrate with $SiO_2/HfO_2$ growth, followed by postdeposition annealing. The pFET stack is deposited subsequently, along with a barrier layer and N-type material layer. This is followed by lithography and reactive ion etch, so that the pFET gate stack is removed from the nFET region. An nFET gate stack is then deposited in the nFET region, and cobalt is then deposited as the gate electrode. Further steps, such as chemical mechanical polishing, typical for production of such devices can be added at the end of the process.

In some aspects of the fifth embodiment, the substrate includes silicon and germanium.

In, some embodiments, forming the second transistor further comprises depositing a nFET stack.

As described above, embodiments of the present invention provide methods of making semiconductor devices with electrodes comprising cobalt. The inventive process flow optimizes the resistivity of the finishes devices. Embodiments of the inventive device structure and methods provide reduced resistivity in semiconductor devices.

Each of the embodiments shown in FIGS. 1-5 further defines devices made by the above methods. In some embodiments the devices have critical dimensions in a range from about 5 to about 50 nm, or from about 10 to about 40 nm, or from about 10 to about 30 nm.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

EXAMPLES

Example 1

Figure 6:
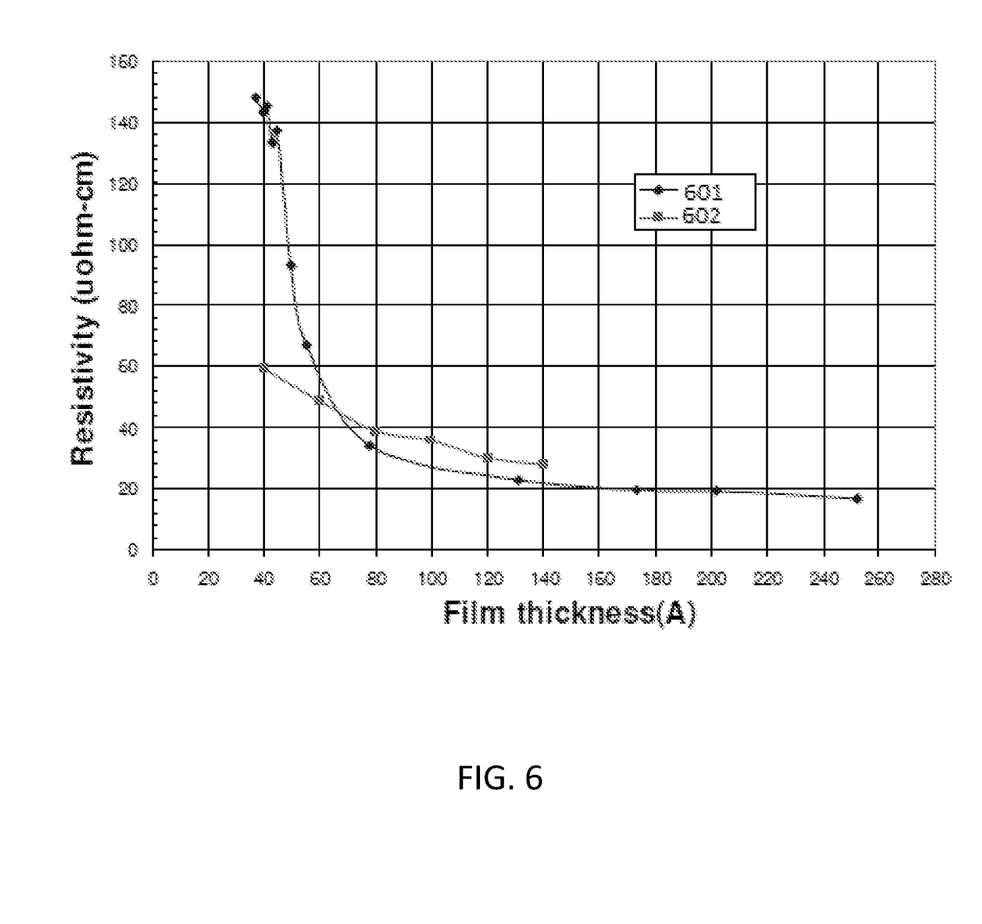
FIG. 6 is a graph of resistivity vs. film thickness of cobalt and tungsten films.

A graph of resistivity (μohm-cm) vs. film thickness (Å) of cobalt and tungsten films deposited by chemical vapor deposition is shown in FIG. 6. Trace 601 is for tungsten films, and trace 602 is for cobalt films. The figure shows that cobalt films have lower resistivity than tungsten films below a thickness of about 65 Å.

What is claimed is:
1. A semiconductor device, comprising:
an nFET and a pFET on a substrate;
wherein the nFET comprises a first high-k dielectric layer disposed in and along the inner sidewalls of a first trench arranged on the substrate, an nFET stack disposed directly on the first high-k dielectric layer, the nFET stack comprising a first metal layer, a second metal layer, and a third metal layer, a barrier layer disposed directly on the nFET stack, a first n-type material layer disposed directly on the barrier layer, and a first conductive metal consisting essentially of cobalt disposed directly on the first n-type material layer, wherein the first conductive metal is the innermost layer in the first trench and fills a remaining interior space of the first trench;

wherein the pFET comprises a second high-k dielectric layer disposed in and along the inner sidewalls of a second trench on the substrate, the barrier layer disposed directly on the second high-k dielectric layer, a second n-type material layer disposed directly on the barrier layer, and a second conductive metal consisting essentially of cobalt disposed directly on the second n-type material layer, wherein the second conductive metal is the innermost layer in the second trench and fills a remaining interior space of the second trench; and wherein the cobalt has a film thickness of 40 to 60 Angstroms and a resistivity of 40 to 60 µohm-cm.

2. The device of claim 1, wherein the substrate comprises silicon or germanium or a combination thereof.

3. The device of claim 1, further comprising an N-type material layer deposited on the barrier layer or pFET work function layer, wherein the N-type material layer comprises hafnium, zirconium, titanium, tantalum, aluminum, hafnium carbide, zirconium carbide, titanium carbide, tantalum carbide, aluminum carbide, or a combination thereof.

4. The device of claim 1, wherein the first high-k dielectric layer comprises one or more of oxides, nitrides, oxynitrides, silicates, aluminates, titanates, nitrides, or any combination thereof.

5. The device of claim 4, wherein the first high-k dielectric layer comprises one or more of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

6. The device of claim 1, wherein the nFET stack comprises one or more metal layers, the metal layers comprising one or more n-type work function materials.

7. The device of claim 1, wherein the barrier layer or work function layer comprises one or more metal nitrides.

8. The device of claim 1, wherein the second high-k dielectric layer comprises one or more of oxides, nitrides, oxynitrides, silicates, aluminates, titanates, nitrides, or any combination thereof.

9. The device of claim 8, wherein the second high-k dielectric layer comprises one or more of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

10. The device of claim 6, wherein the one or more n-type work function materials comprise one or more of hafnium, zirconium, titanium, tantalum, aluminum, aluminides, TiAl, metal nitrides, and metal carbides.

11. The device of claim 6, wherein the n-type work function materials comprise one or more of hafnium carbide, zirconium carbide, titanium carbide, aluminum carbide, and combinations thereof.

12. The device of claim 7, wherein the metal nitrides comprise one or more of titanium nitride, tantalum nitride, and combinations thereof.

13. The device of claim 7, further comprising a pFET work function metal.

* * * * *